(12) United States Patent
Sasson

(10) Patent No.: US 9,958,485 B2
(45) Date of Patent: May 1, 2018

(54) ON-CHIP MILLIMETER-WAVE POWER DETECTION CIRCUIT

(75) Inventor: Ori Sasson, Nesher (IL)

(73) Assignee: QUALCOMM Incorporated, San Diego, CA (US)

( * ) Notice: Subject to any disclaimer, the term of this patent is extended or adjusted under 35 U.S.C. 154(b) by 1005 days.

(21) Appl. No.: 13/232,124

(22) Filed: Sep. 14, 2011

(65) Prior Publication Data
US 2012/0293163 A1 Nov. 22, 2012

Related U.S. Application Data

(60) Provisional application No. 61/487,381, filed on May 18, 2011.

(51) Int. Cl.
  *G01R 1/06* (2006.01)
  *G01R 21/12* (2006.01)
  *H04B 17/10* (2015.01)

(52) U.S. Cl.
  CPC .......... *G01R 21/12* (2013.01); *H04B 17/102* (2015.01)

(58) Field of Classification Search
  None
  See application file for complete search history.

(56) References Cited

U.S. PATENT DOCUMENTS

| 5,512,824 | A | 4/1996 | Adler et al. |
| 6,169,410 | B1 | 1/2001 | Grace et al. |
| 6,429,720 | B1 * | 8/2002 | Gilbert .......................... 327/348 |
| 8,390,403 | B1 * | 3/2013 | Schaffner ................ H01P 5/107 333/250 |
| 2008/0224922 | A1 | 9/2008 | Cleland et al. |
| 2008/0265919 | A1 | 10/2008 | Izadian |

OTHER PUBLICATIONS

Sleiman, S. B. et al. "Millimeter-Wave BiST and BiSC using a High-Definition Sub-Ranged Detector in 90nm CMOS". 2010, IEEE, 53rd IEEE International Midwest Symposium on Circuits and Systems pp. 477-480.*
Branchline Couplers, Feb. 19, 2007, Microwaves101.com, WaybackMachine Internet Archive website capture from Dec. 30, 2009. Of url: http://microwaves101.com/encyclopedia/Resistive_tap.cfm.*
Gorisse, Jean, et al.; "A 60GHz 65nm CMOS RMS Power Detector for Antenna Impedance Mismatch Detection"; Proceedings of ESSCIRC 2009; Athens; Sep. 14-18, 2009; pp. 172-175.
Pfeiffer, Ullrich R., and Goren, David; "A 20 dBm Fully-Integrated 60 GHz SiGe Power Amplifier with Automatic Level Control"; IEEE Journal of Solid-State Circuits, vol. 42, No. 7, Jul. 2007; pp. 1455-1463.

* cited by examiner

*Primary Examiner* — Daniel Miller
(74) *Attorney, Agent, or Firm* — Patterson & Sheridan, L.L.P.

(57) ABSTRACT

An on-chip millimeter wave power detection circuit comprises a high resistive probe for voltage sensing of millimeter wave signals, the probe comprises a metal line perpendicularly connected to a transmission line, at one end, and further connected to a power root mean square (RMS) detector at the other end; and the RMS detector for measuring a RMS voltage value of the sensed millimeter wave signals, wherein the RMS detector is characterized by a known impedance.

19 Claims, 7 Drawing Sheets

ON-CHIP MILLIMETER-WAVE POWER DETECTION CIRCUIT

CROSS-REFERENCE TO RELATED APPLICATIONS

This application claims that benefit of U.S. provisional application No. 61/487,381 filed May 18, 2011 the contents of which are incorporated herein by reference.

TECHNICAL FIELD

The present invention relates generally to millimeter wave electronics, and more particularly to circuits for on-chip voltage sensing of millimeter wave signals.

BACKGROUND OF THE INVENTION

The 60 GHz band is an unlicensed band that features a large amount of bandwidth, which means that a very high volume of information can be transmitted wirelessly. As a result, multiple applications that require transmission of a large amount of data can be developed to allow wireless communication around the 60 GHz band. Examples for such applications include, but are not limited to, wireless high definition TV (HDTV), wireless docking station, wireless Gigabit Ethernet, and many others. The objective of the industry is to integrate 60 GHz band applications with portable devices including, but not limited to, netbook computers, tablet computers, smart-phones, laptop computers, and the like. The physical size of such devices is relatively small, and thus the area for installing additional circuitry to support 60 GHz applications is limited; therefore circuits that should be fabricated on a radio frequency IC (RFIC) should be carefully selected.

One of the elements typically included in a RFIC designed for millimeter-wave frequencies is a power and/or voltage detector. As illustrated in FIG. 1, a detector 100 is typically coupled between a power amplifier 110 and an antenna 120 using a probe 130. The detector 100 and probe 130 are on-chip, which means that they are part of the RFIC. On-chip power detection circuits are implemented at millimeter-wave frequencies on the RFIC mainly for performing automatic gain control that mitigates the impact of fabrication process, voltage, and temperature variations, enabling a built-in self-test (BIST) for low-cost and high-volume production, and for voltage standing wave ratio (VSWR) protection.

Existing solutions for on-chip power detection use a coupler-based probe 130. This type of probe includes capacitors that are integrated inside the amplifier's 110 output transmission lines 101. The probe 130 senses the voltage at the output of the amplifier 110, and then the voltage is converted into power measured by the detector 100. The measured power is proportional to the power of the RF signal at the output of the power amplifier 110.

The signal power detection requires squaring and filtering to measure the signal's root mean square (RMS) value. The detector 100 is indirectly connected to the sensed signal (i.e., through the probe 130), thus it introduces additional load between the amplifier 110 and the antenna 120. In millimeter wave RFICs, any additional load to a RF circuit has a significant impact on return and insertion losses, thereby reducing the circuit's performance. Therefore, the detector 100 should be carefully designed so that its operation would not adversely impact the other electrical components in the circuit under test. Specifically, the detector squares the sensed signal, an operation that results with a signal that includes various components to its outputs. For example, the frequency components may include direct current (DC), the signal main frequency (e.g., 60 GHz) and its harmonies. All frequencies except the DC must be filtered to avoid any aberrational RF signals to be transferred from the output of the detector, as such signals may induce, for example, noise and distortions in the circuit. Furthermore, the detector's load is not always modeled to RF frequencies, so its behavior cannot be properly predicated in simulations unless aberrational RF signals are eliminated.

Examples for power detection techniques using a coupler-based probe can be found in "*A 60 GHz 65 nm CMOS RMS Power Detector for Antenna Impedance Mismatch Detection*" to Gorisse, et al. and "*A 20 dBm Fully-Integrated 60 GHz SiGe Power Amplifier With Automatic Level Control*" to Pfeiffer, et al.

One of the drawbacks of the conventional RMS detectors, such as those described in the above-referenced documents, is that the proposed detectors use P-type metal-oxide-semiconductor (PMOS) components within the millimeter-wave section of the circuit. However, such devices require very good RF models in the main frequency of the signal being measured. A model (or a high frequency model) for any PMOS component is necessary in order to guarantee a good match between a simulated circuit and a silicon-fabricated circuit. Such a model usually includes a core model, provided by the factory, and a RF model for additional RF components. The RF models, specifically for PMOS and NMOS devices in the 60 GHz frequency band, are not provided by the factory, thus should be determined by the IC designer. However, the process of RF modeling for PMOS devices requires several tape-outs, directed measurements, proper de-embedding techniques, fitting processes, and so on. This a costly and time consuming task.

In addition, the on-chip power detection circuits discussed in the related art are based on coupler-based probes. The drawbacks of the coupler-based probes are that probing signals involve voltage coupling, hence the coupler (or probe) affects the sensed signals and the RF path between the amplifier and antenna. That is, the coupler degrades the RF signal and changes the impedance characteristics of the transmission line, thereby causing RF signal losses. In millimeter-wave RFICs, signal losses should be minimized to enable proper operation of the device. With this aim, a capacitive coupler probe should be carefully designed to mitigate the RF losses and changes to the characteristic impedance of the transmission line. However, this is a tedious task that cannot always resolve the above problems, due for example, to other constraints of the design.

Therefore, it would be advantageous to provide an efficient solution for voltage sensing and power detection of millimeter-wave signals that would overcome the drawbacks of conventional on-chip power detection circuits.

SUMMARY OF THE INVENTION

Certain embodiments of the invention disclosed herein include an on-chip millimeter wave power detection circuit. The circuit comprises a high resistive probe for voltage sensing of millimeter wave signals, the probe comprises a metal line perpendicularly connected to a transmission line, at one end, and further connected to a power root mean square (RMS) detector at the other end; and the RMS detector for measuring a RMS voltage value of the sensed millimeter wave signals, wherein the RMS detector is characterized by a known impedance.

Certain embodiments of the invention disclosed herein also include a high impedance on-chip probe for voltage sensing of millimeter wave signals, the probe comprises a metal line perpendicularly connected to a transmission line, at one end, and further connected to a power root mean square (RMS) detector at the other end, wherein the connection to the transmission line is to a middle metal layer between a metal layer on which the transmission line is fabricated on a ground layer of a multilayer semiconductor substrate.

Certain embodiments of the invention disclosed herein further include an on-chip root mean square (RMS) power detector for measuring RMS voltage of millimeter wave signals travelled on a transmission line and sensed by a high resistive probe. The RMS power detector comprises an input capacitor coupled to the high resistive probe and characterized by a low serial impedance; a metal-oxide-semiconductor-field-effect-transistor (NMOS) device coupled to the input capacitor, the NMOS device performs a squaring function on the sensed millimeter wave signals, the NMOS device is characterized by a low load and a high impedance; an output filter for outputting only direct current (DC) components of the sensed millimeter wave signals; and a DC load circuitry for sampling the DC components delivered from the output filter and converting the DC components to RMS voltage value.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF THE INVENTION

Figure 1:
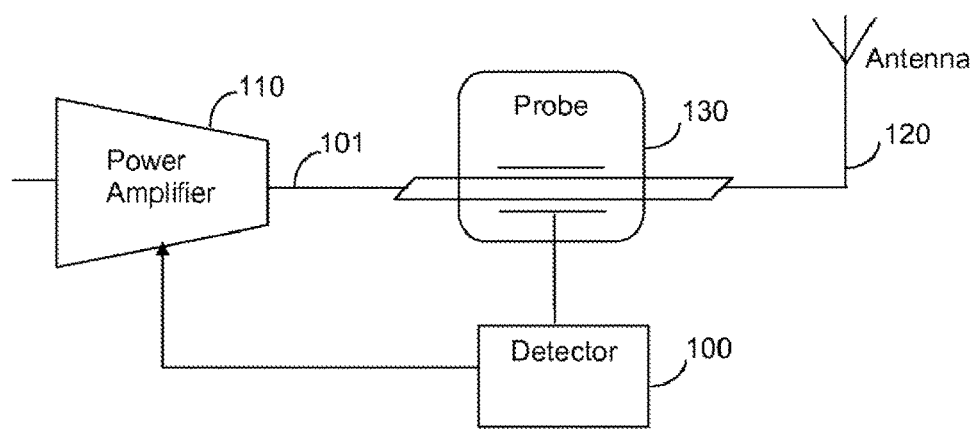
FIG. 1 is a diagram of a conventional power detection circuit.

The embodiments disclosed by the invention are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

Figure 2:
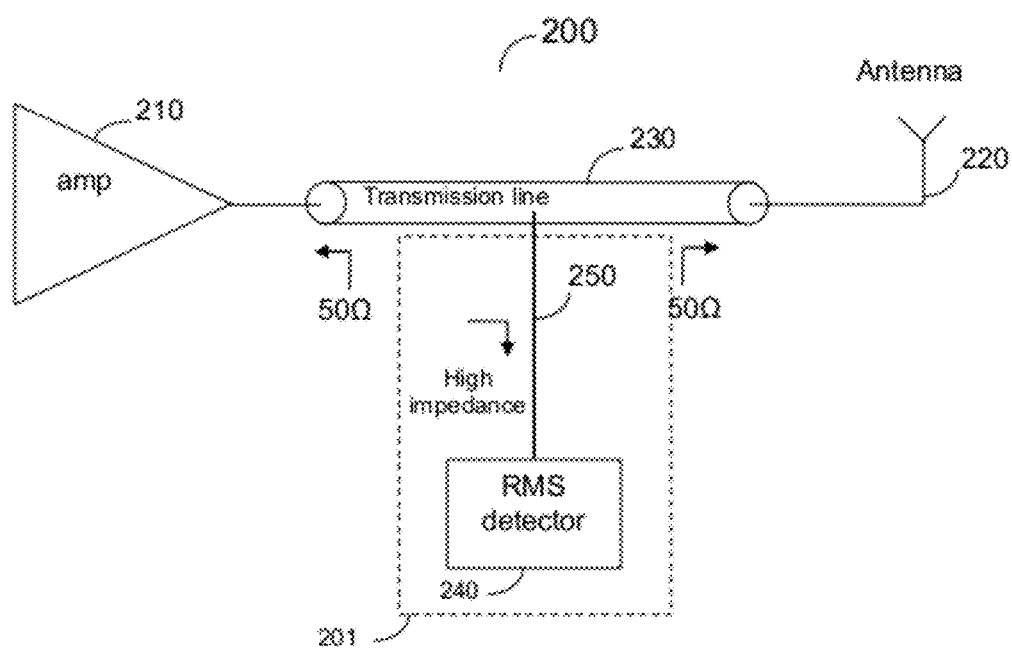
FIG. 2 is a diagram of an on-chip millimeter-wave power detection circuit designed according to certain embodiments of the invention.

FIG. 2 shows an exemplary diagram of a RFIC 200 which includes an on-chip millimeter-wave (mm-Wave) power detection circuit 201 designed according to certain embodiments of the invention. The RFIC 200 also includes a power amplifier 210 connected to an antenna 220 through a transmission line 230. The on-chip millimeter-wave power detection circuit 201 is capable of measuring the power of a signal at the output of the amplifier 210.

The on-chip millimeter-wave power detection circuit 201 includes a RMS detector 240 and a probe 250 constructed according to the embodiments disclosed herein. The RMS detector 240 may be further connected to a controller (not shown) for the purpose of performing, for example, automatic gain control (AGC). In an embodiment of the invention, the circuit 200 operates in the 60 GHz frequency band.

Figure 7:
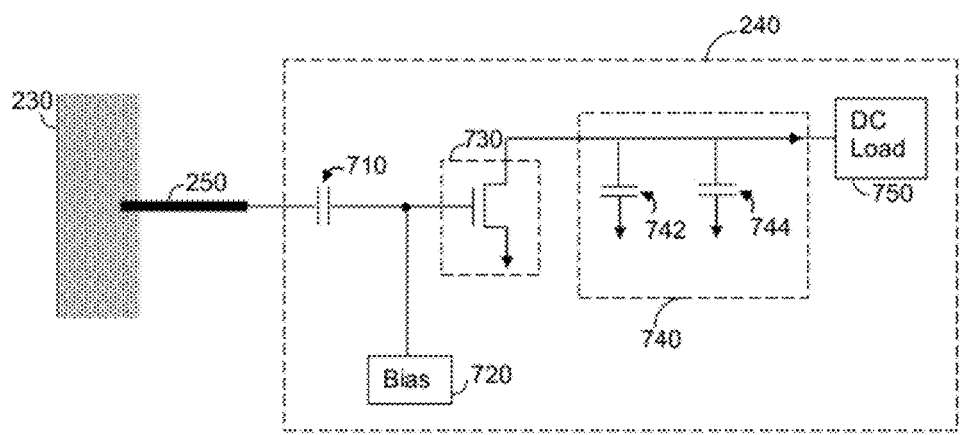
FIG. 7 is a diagram of a RMS detector designed according to certain embodiments of the invention.

As will be describe in greater detail below with reference to FIG. 7, the detector 240 is a root mean square (RMS) detector that is based on a "smallest-modeled" Metal-Oxide-Semiconductor-Field-Effect-Transistor (NMOS FET) (or NMOS) device with a modeled filter connected at the output of the NMOS device. A NMOS device conducts negative charges (electrons) between its "source" and "drain" terminals, based on an electrical field, which is dictated by the "gate" and "source" terminals voltage. The capacitor provides a short in the main frequency of the transmit/receive signals (e.g., at the 60 GHz).

The NMOS device is selected to have the smallest size, in terms of number of transistors, for which the RF model is still valid. As mentioned above, a circuit design must use a reliable model in order to guarantee a good match between a simulated and the fabricated circuit. As further described above, RF models are not available to CMOS and PMOS devices in the 60 GHz frequency band. Thus, according to an embodiment of the invention, a smallest NMOS device having a reliable RF model is utilized in the RMS detector. Such a device ensures low impedance and reduced load. The RF model for the NMOS device is selected from a library of predefined models.

It should be noted that merely selecting the smallest NMOS device that can be fabricated may not result in an operable detector, as such a device may not be perfectly modeled. It is further noted that using a modeled NMOS device and scaling down the device would not guarantee a match between a simulated and the fabricated device, as changing the size of the NMOS device affects its behavior.

The small modeled dimensions of the NMOS device of the detector 240 together with the high resistive probe 250 provide high and known impedance for the on-chip detection circuit 200. As a result, the impact of non-filtered RF signals output by the detector 240 can properly simulated, thus return and insertion losses can be mitigated.

The probe 250 is a high impedance resistive probe attached to the transmission line 230. In one embodiment of the invention, the probe 250 is an ultra thin metal line perpendicularly connected to the transmission line 230. The probe 250 represents, to the detector 240, high impedance relative to the sensed RF signal, thereby lost energy of the sensed signals is significantly reduced and in most cases does not exist. Further, the physical dimensions of the probe 250 introduces negligible impact to the characteristic impedance of the transmission line 230. That is, if the characteristic impedance of the transmission line 230 is 50Ω, this would remain on both sides of the transmission line 230. To achieve this, the width of the metal line forming the probe 250 is designed to be the minimum (or very close to) width allowed by the process utilized for fabricating the designed element. Further, the widths of the probe 250 and transmission line 230 are selected in such a way that the width of the probe 250 is significantly narrower than the width of the transmission line 230. In an exemplary embodiment, the width of the probe is 40 times narrower than the width of the transmission line 230. For example, when a 7-copper metal layers deep sub-micron used for 65 nanometer (nm) CMOS fabrication process is utilized, the width of the probe's metal line 250 is 0.1 micron, while the width of transmission line 230 is 4 micron.

At one end, the probe 250 is connected to one of the metal layers of the multilayer semiconductor substrate. As will be described in detail below, the probe 250 is attached to a metal layer which is different from the layer on which the transmission line 230 passes. At its other end, the probe 250 is connected to the detector 240. Close to the connection with the detector 240 (and far enough from the transmission line 230), the metal line of the probe 250 is gradually widened to allow proper, continuous connection to the detector 240.

Figure 3:
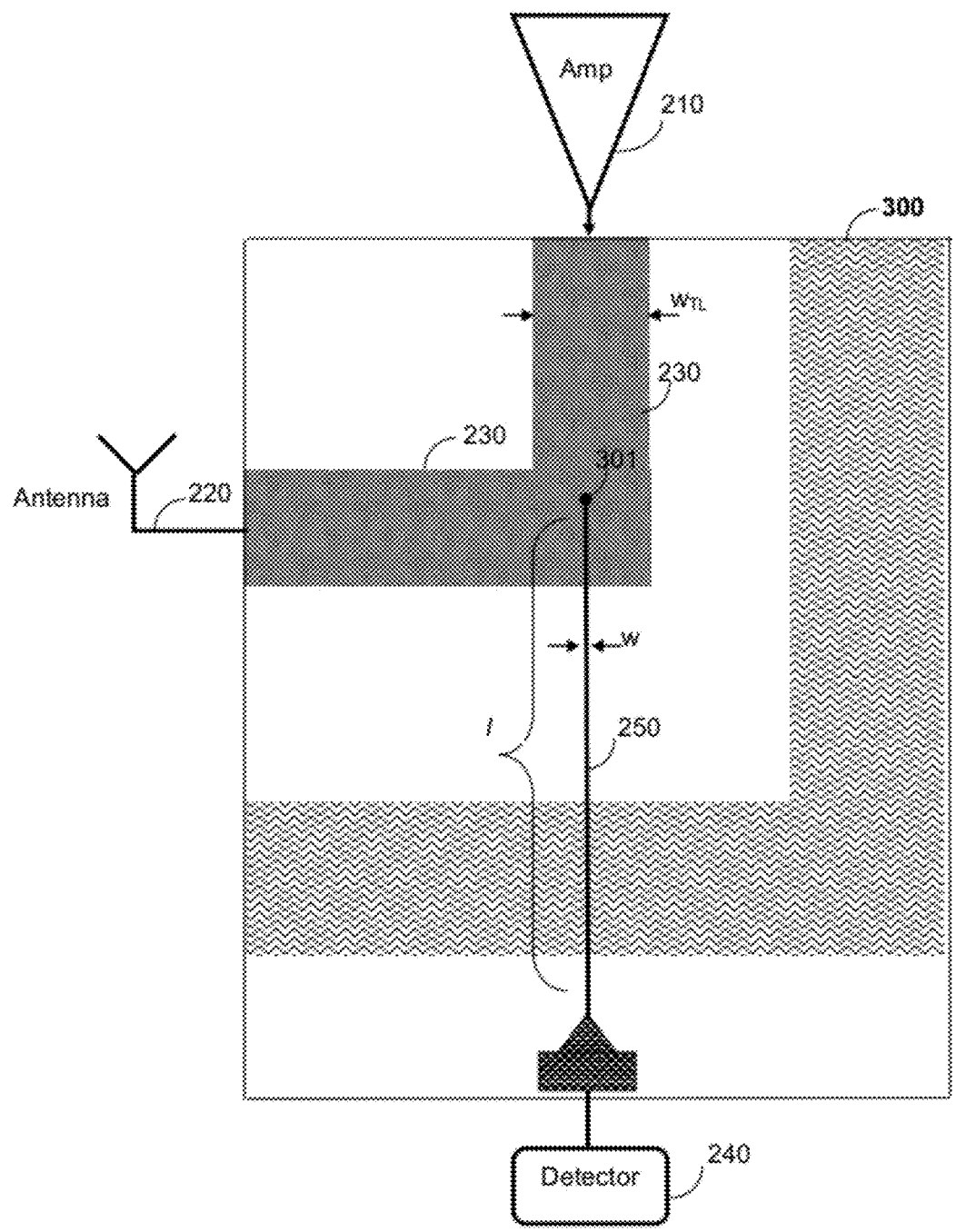
FIG. 3 is a layout diagram of the probe as fabricated on a multilayer semiconductor substrate according to an embodiment of the invention.

FIG. 3 shows a layout diagram illustrating the connection of the probe 250 to the transmission line 230 and detector 240 as fabricated on a substrate 300 according to an embodiment of the invention. The substrate 300 is a multilayer semiconductor substrate. In an exemplary embodiment, the substrate 300 includes seven metal layers, where the first layer is the ground. The dimensions of the probe 250, width (w) and length (l) are determined to provide impedance matching between antenna 220 and amplifier 210 and to minimize energy loss. As mentioned above, the width of the probe 250 is selected to be the minimum width allowed by the fabrication process, and significantly less than the width (wTL) of the transmission line 230. The length (l) of the probe 250, and hence the location of the detector 240 is selected based on the distance of the transmission line 230 to the sidewalls of the substrate 300. The detector 240 is always abutted to the transmission line 230. In an embodiment of the invention, the connection of the probe 250 to the transmission line 230 is at the corner of the line.

Figure 4:
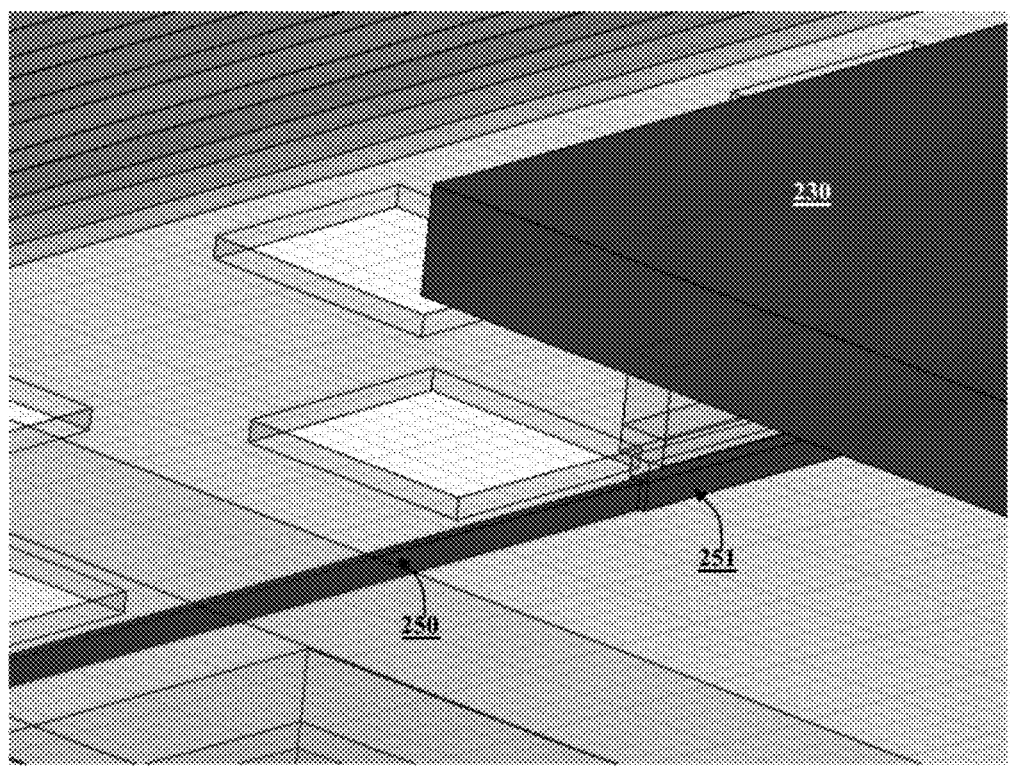
FIG. 4 is a 3-dimensional diagram illustrating the connection of the probe and transmission line according to an embodiment of the invention.

The connection at a point 301 of the probe 250 to the transmission line 230 and substrate 300 is illustrated in greater detail in FIG. 4. The probe 250 is inserted into a metal layer that is not the metal layer on which the transmission line passes, and not the ground layer. In a preferred embodiment, the metal layer is selected to be the middle layer between the transmission line's layer and the ground layer to minimize parasitic capacitance from the probe 250 and the line 230 to the side shields of the transmission line. For example, in a 7-layer substrate, a fifth layer is selected as the layer to insert the probe, where the transmission line is on the seventh layer.

In accordance with an embodiment of the invention, a hole (not shown) is created in a side shield of the probe's selected layer (layer five) for connecting the probe 250 to the transmission line. In another embodiment, the probe 250 is connected to the transmission line through a via.

An endpoint 251 of the probe 250 is connected to the transmission line 230, i.e., a metallic contact is formed between the two conductors. As a result, the probe 250 and the transmission line 230 have the same electrical potential. The detector's 240 ground is the same ground of the transmission line 230, and the electrical voltage of the signal is directly delivered to the detector 240 (not show in FIG. 4) through the probe 250.

It should be noted that the connectivity of the probe to the substrate and transmission lines as well as the dimensions of the probe ensures impedance matching between all the elements of a millimeter-wave power detector circuit shown, for example, in FIG. 2. This is in contrast to prior art solutions that require careful tuning of the capacitor of the coupler-based probe to achieve impedance matching. In addition, the signal loss when using proposed probe 250 is very small. These properties are clearly evident in FIG. 5.

Figure 5:
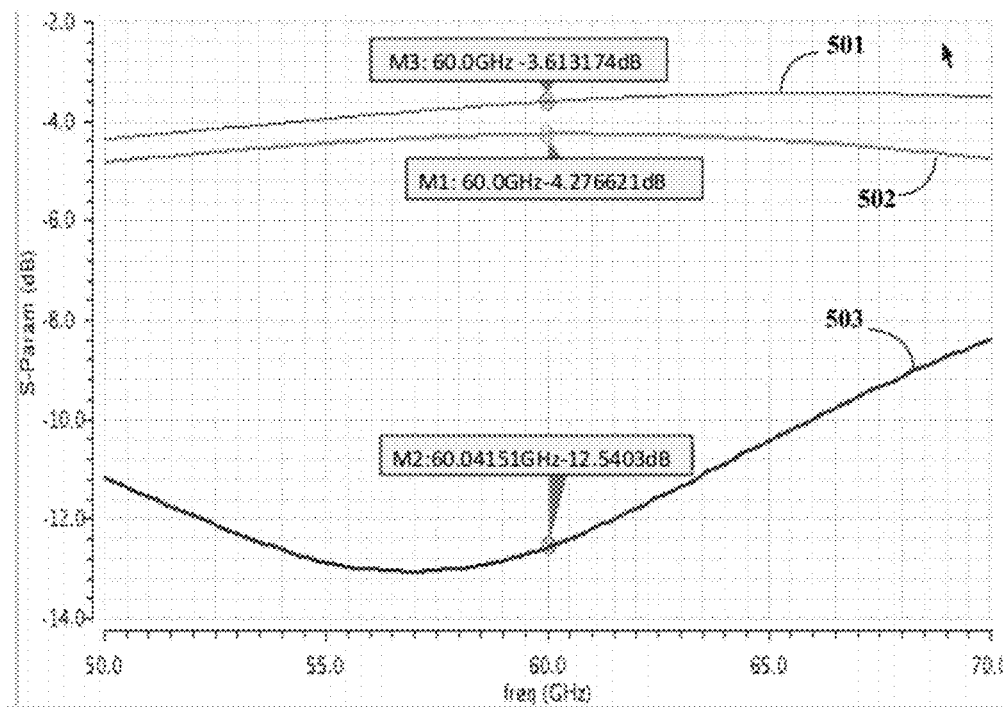
FIG. 5 depicts graphs illustrating signal loss measured for a typical antenna with and without the power detection circuit, and a matching of the typical antenna with the power detection circuit designed in accordance with an embodiment of the invention.

FIG. 5 depicts graphs 501 and 502 showing the signal loss with and without using the power detection circuit 201 (detector 240 and probe 250) in a typical antenna. As can be noticed, in the main frequency (60 GHz) the difference of the power level of a signal with the power detection circuit 201 (graph 501) versus without the circuit 201 (graph 502) is less than 0.7 dB. A person with ordinary skill the art should appreciate that such a result represents a very low loss, thus good performance of the probe.

FIG. 5 also depicts a graph 503 of return-loss varying with frequency measured for a typical antenna operating in a 60 GHz frequency band. The return-loss is a measure of voltage standing wave ratio (VSWR), expressed in decibels (db) and may be caused due to an impedance mismatch. A low value of return-loss denotes better impedance matching of the electrical element under test. The graph 503 represents a simulation of a power amplifier-antenna matching with the power detection circuit 201. As can be noticed for 60 GHz frequency band, each measured return-loss is below −12 dB. A person with ordinary skill the art should appreciate that such a result represents a low return-loss value, thus good performance of the probe.

Figure 6:
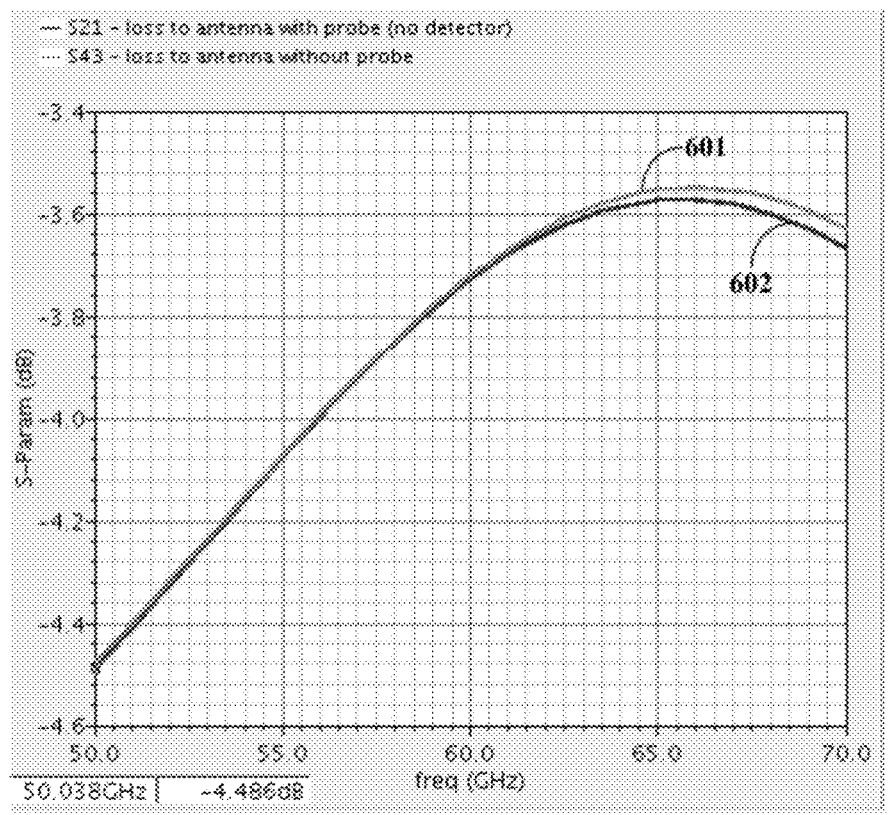
FIG. 6 depicts graphs illustrating signal loss measured for a typical antenna with and without the probe designed in accordance with an embodiment of the invention.

FIG. 6 depicts graphs 601 and 602 showing the signal loss with and without using the probe 250 in a typical antenna. As can be noticed, in the worst-case (up to 66 GHz), the difference of the power level of a signal with the probe (graph 601) versus without the probe (graph 602) is less than 0.04 dB. A person with ordinary skill the art should appreciate that such a result represents a negligible loss, thus good performance of the probe FIG. 7 shows an exemplary and non-limiting diagram of the RMS detector 240 implemented according to an embodiment of the invention. The RMS detector 240 is connected to the probe 250 which senses millimeter wave signals in the transmission line 230. The connection between the transmission line 230, probe 250, and the detector 240 is as discussed in greater detail above.

The detector 240 consists of an input capacitor 710 coupled to a NMOS device 730 being biased by the current bias unit 720. At the output of the NMOS device 730 there are connected an output filter 740 and a DC load unit 750.

The input capacitor 710 has a high capacity value (for example 300 fF) which presents very low serial impedance in the main frequency of the signal being travelled through the transmission line 230. In an exemplary embodiment of the invention, the main frequency of the signal is 60 GHz. The low serial impedance of the capacitor 710 introduces only slight voltage degradation in the amplitude of the detected signal.

The NMOS device 730 performs the squaring function on the sensed RF signal. The NMOS device 730 is biased around the threshold voltage (e.g., approximately 500 mV) of the NMOS transistors (of the device 730) in order to maximize non-linearity of the squaring function. As mentioned above, the NMOS device 730 is the smallest modeled NMOS device ensuring a match between simulated and fabricated NMOS device, hence the RFIC. The small size of the NMOS device 730 ensures high impedance characterization. In an exemplary embodiment of the invention, the size of the NMOS device is 12 fingers of a length of 1 micron each.

The output filter 740 includes a bypass capacitor 742 and a low frequency capacitor 744. The bypass capacitor 742 is chosen so its self-resonance frequency is achieved in the main frequency of the sensed signal (e.g., 60 GHz), thus providing a short at the main frequency of the signal. The bypass capacitor 740 eliminates the impact of any circuitry connected to the detector 240, as it sets extremely low impedance on the detector's 240 output. As a result, an accurate model for the detector's load in the main frequency band is not required, as the input impedance of the detector is known reliably from simulations. This is achieved by reliable NMOS & output filter models.

The bypass capacitor 742 also extracts all the RF components from the output of the NMOS device 730, allowing delivery of only DC components to the DC load circuit 750. The low frequency filter capacitor 742 averages the baseband frequency components of the signal that were not filtered by the capacitor 742. The baseband frequency components are in the frequency band between DC and 900 MHz.

It should be noted that since the sensed signal is dynamic, wideband, and not composed of only one tone in fixed amplitude, the frequency filter capacitor 742 is required in the output filter 740. That is, averaging the signal allows for a more stable DC value, representing the sensed signal's RMS.

The DC load circuitry 750 samples the DC current delivered from the output filter 740 and converts the RMS current to RMS voltage value.

It is important to note that these embodiments are only examples of the many advantageous uses of the innovative teachings herein. Specifically, the innovative teachings disclosed herein can be adapted in any type of consumer electronic devices where reception and transmission of millimeter wave signals is needed.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. An apparatus for detecting power, comprising:
   a power root mean square (RMS) detector;
   a high impedance probe for voltage sensing of signals, the probe comprising a metal line connected to the power root mean square (RMS) detector, wherein the metal line is connected to a transmission line, and wherein a dimension of the probe is configured for impedance matching with one or more elements of the power RMS detector wherein the power RMS detector is configured to measure a RMS voltage value of the sensed signals, and wherein the power RMS detector comprises:
   an input capacitor coupled to the high-impedance probe;
   an n-channel metal-oxide semiconductor (NMOS) transistor coupled to the input capacitor, the transistor being configured to perform a squaring function on the sensed signals; and
   an output filter configured to generate a filtered signal based on the squared signals and provide the filtered signal to an output node, wherein a drain of the NMOS transistor is only connected to the output filter.

2. The apparatus of claim 1, wherein the metal line is connected to the transmission line through a middle metal layer between a metal layer on which the transmission line is fabricated and a ground layer of a multilayer semiconductor substrate.

3. The apparatus of claim 2, wherein the metal line is connected to the transmission line through a hole in the middle metal layer.

4. The apparatus of claim 2, wherein the metal line is connected to the transmission line through the middle metal layer by a via.

5. The apparatus of claim 1, wherein the probe and transmission line have the same electrical potential.

6. The apparatus of claim 1, wherein a width of the metal line is narrower than a width of the transmission line.

7. The apparatus of claim 1, wherein a width of the metal line is 0.1 micron, and a width of the transmission line is 4 micron.

8. The apparatus of claim 1, wherein the output filter is configured to output direct current (DC) components of the squared signals, and wherein the power RMS detector further comprises:
   DC load circuitry coupled to the output node and configured to sample the DC components and convert the DC components to the RMS voltage value.

9. The apparatus of claim 8, wherein the output filter includes:
   a bypass capacitor configured to extract RF components at a main frequency of the squared signals to generate a filtered signal; and
   a low frequency filter capacitor configured to average baseband frequency components of the filtered signal.

10. The apparatus of claim 9, wherein the main frequency of the sensed signals operate in a 60 GHz frequency band.

11. A method for power detection, comprising:
    sensing signals with a high impedance probe, wherein the probe comprises a metal line connected to a power root mean square (RMS) detector, wherein the metal line is connected to a transmission line, and wherein a dimension of the probe is configured for impedance matching with one or more elements of the power RMS detector; and
    measuring a RMS voltage value of the sensed signals via the power RMS detector, wherein the power RMS detector comprises:
    an input capacitor coupled to the high-impedance probe;
    an n-channel metal-oxide semiconductor (NMOS) transistor coupled to the input capacitor, the transistor being configured to perform a squaring function on the sensed signals; and
    an output filter configured to generate a filtered signal based on the squared signals and provide the filtered signal to an output node, wherein a drain of the NMOS transistor is only connected to the output filter.

12. The method of claim 11, further comprising connecting the metal line to the transmission line through a middle metal layer between a metal layer on which the transmission line is fabricated and a ground layer of a multilayer semiconductor substrate.

13. The method of claim 12, further comprising connecting the metal line to the transmission line through a hole in the middle metal layer.

14. The method of claim 12, further comprising connecting the metal line to the transmission line through the middle metal layer by a via.

15. The method of claim 11, wherein the probe and transmission line have the same electrical potential.

16. The method of claim 11, wherein a width of the metal line is narrower than a width of the transmission line.

17. The method of claim 11, wherein a width of the metal line is 0.1 micron, and a width of the transmission line is 4 micron.

18. The method of claim 11, wherein the output filter is configured to output direct current (DC) components of the squared signals, and wherein the power RMS detector further comprises DC load circuitry coupled to the output node and configured to sample the DC components and convert the DC components to the RMS voltage value.

19. A wireless device, comprising:
an antenna;
a radio-frequency integrated circuit (RFIC) comprising a transmission line coupled to the antenna; and
a power root mean square (RMS) detector; and
a high impedance probe for voltage sensing of signals, the probe comprising a metal line connected to the power RMS detector, wherein the metal line is connected to the transmission line, and wherein a dimension of the probe is configured for impedance matching with one or more elements of the power RMS detector, wherein the power RMS detector is configured to measure a RMS voltage value of the sensed signals, wherein the power RMS detector comprises:
an input capacitor coupled to the high-impedance probe;
an n-channel metal-oxide semiconductor (NMOS) transistor coupled to the input capacitor, the transistor being configured to perform a squaring function on the sensed signals; and
an output filter configured to generate a filtered signal based on the squared signals and provide the filtered signal to an output node, wherein a drain of the NMOS transistor is only connected to the output filter.

\* \* \* \* \*